United States Patent
Ragonese et al.

(10) Patent No.: US 9,306,614 B2
(45) Date of Patent: Apr. 5, 2016

(54) POWER OSCILLATOR APPARATUS WITH TRANSFORMER-BASED POWER COMBINING FOR GALVANICALLY-ISOLATED BIDIRECTIONAL DATA COMMUNICATION AND POWER TRANSFER

(71) Applicant: STMicroelectronics S.r.l., Agrate Brianza (IT)

(72) Inventors: Egidio Ragonese, Aci Catena (IT); Vincenzo Fiore, Fiumefreddo di Sicilia (IT); Nunzio Spina, Catania (IT); Pierpaolo Lombardo, Calascibetta (IT); Giuseppe Palmisano, S. Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/631,397

(22) Filed: Feb. 25, 2015

(65) Prior Publication Data

US 2015/0180528 A1 Jun. 25, 2015

Related U.S. Application Data

(63) Continuation-in-part of application No. 14/216,037, filed on Mar. 17, 2014, now Pat. No. 9,240,752.

(30) Foreign Application Priority Data

Mar. 26, 2013 (IT) .............................. MI2013A0454

(51) Int. Cl.
*H04B 1/40* (2015.01)
*H04L 27/08* (2006.01)
(Continued)

(52) U.S. Cl.
CPC ................ *H04B 1/40* (2013.01); *H03B 5/1212* (2013.01); *H03B 5/1228* (2013.01);
(Continued)

(58) Field of Classification Search
CPC .. H03B 5/1212; H03B 5/1228; H03B 5/1296; H01F 2019/085; H02M 3/33523; H04B 1/40; H04B 2203/547; H04B 3/548; H04B 3/54; H04L 27/08; G08C 19/16; G08C 19/02
See application file for complete search history.

(56) References Cited

U.S. PATENT DOCUMENTS

| | | | | |
|---|---|---|---|---|
| 5,473,323 A | * | 12/1995 | Kreft | G06K 7/0008 235/380 |
| 7,019,611 B2 | * | 3/2006 | Kaku | H01F 19/08 336/178 |

(Continued)

FOREIGN PATENT DOCUMENTS

| | | |
|---|---|---|
| CN | 102170289 A | 8/2011 |
| KR | 101138487 B1 | 4/2012 |

OTHER PUBLICATIONS

A. Allam, et al, "Synchronization of mutually coupled LC-oscillators," in IEEE ISCAS, May 2006.

(Continued)

*Primary Examiner* — Sophia Vlahos
(74) *Attorney, Agent, or Firm* — Gardere Wynne Sewell LLP

(57) ABSTRACT

An apparatus includes first and second oscillator circuits. A transformer has a primary winding coupling the first oscillator circuit to the second oscillator circuit and a secondary winding. A first outgoing communications circuit is coupled to the second oscillator circuit and drives an amplitude modulated data signal thereto. A first incoming communications circuit is coupled to the primary winding of the transformer. A second outgoing communications circuit is coupled to the secondary winding drives an amplitude modulated data signal thereto. A second incoming communications circuit is coupled to the secondary winding. The secondary winding is magnetically coupled with the primary winding so the secondary winding receives an output power and an incoming data transmission based upon the amplitude modulated data signal, and so the primary winding receives an incoming high speed data transmission based upon the amplitude modulated data signal.

19 Claims, 10 Drawing Sheets

(51) Int. Cl.
*H03B 5/12* (2006.01)
*G08C 19/16* (2006.01)
*G08C 19/02* (2006.01)
*H04B 3/54* (2006.01)

(52) U.S. Cl.
CPC ............. *H03B 5/1296* (2013.01); *H04L 27/08* (2013.01); *G08C 19/02* (2013.01); *G08C 19/16* (2013.01); *H04B 3/54* (2013.01)

(56) References Cited

U.S. PATENT DOCUMENTS

| | | | |
|---|---|---|---|
| 7,295,076 B2 | 11/2007 | Kim et al. | |
| 7,961,056 B2 | 6/2011 | Taylor et al. | |
| 8,058,934 B2 | 11/2011 | Rangarajan et al. | |
| 8,212,625 B2 | 7/2012 | Lee et al. | |
| 8,711,954 B2* | 4/2014 | Florence | H04L 25/0268 375/211 |
| 8,723,609 B2 | 5/2014 | Chang et al. | |
| 8,948,276 B2* | 2/2015 | Kaeriyama | H04L 1/0041 375/258 |
| 8,957,739 B2 | 2/2015 | Lu et al. | |
| 2006/0120115 A1* | 6/2006 | Chen | H02M 3/33523 363/17 |
| 2007/0170909 A1* | 7/2007 | Vorenkamp | G06F 1/266 324/76.11 |
| 2008/0007366 A1 | 1/2008 | Bevilacqua et al. | |
| 2008/0106343 A1 | 5/2008 | Jang et al. | |
| 2008/0284534 A1 | 11/2008 | El Rai | |
| 2009/0213625 A1* | 8/2009 | Adler | H02M 7/10 363/65 |
| 2010/0271086 A1 | 10/2010 | Bao et al. | |
| 2011/0050354 A1 | 3/2011 | Hirashiki et al. | |
| 2011/0057732 A1 | 3/2011 | Taylor et al. | |
| 2011/0148535 A1 | 6/2011 | Lee | |
| 2012/0256290 A1 | 10/2012 | Renna et al. | |
| 2012/0286879 A1 | 11/2012 | Nylen | |
| 2013/0024046 A1* | 1/2013 | Toriya | H02J 5/005 700/297 |
| 2013/0148747 A1* | 6/2013 | Puchiano | H04L 25/026 375/257 |

OTHER PUBLICATIONS

Italian Search Report and Written Opinion for IT MI2013A000454 mailed Oct. 10, 2013 (8 pages).
Jeong Ki Kim et al.; , "A current-reuse quadrature VCO for wireless body area networks," in IEEE/NIH LiSSA, pp. 55-58, 2011.
Khan, T.; Raahemifar, K.; , "A low power current reused quadrature VCO for biomedical applications," in IEEE ISCAS, pp. 669-672, May 24-27, 2009.
Le Zheng et al., "Design and analysis of a current-reuse transmitter for ultra-low power applications," in IEEE ISCAS, pp. 1317-1320, May 24-27, 2009.
Oliveira, L.B. et al., "Synchronization of two LC-oscillators using capacitive coupling," in IEEE ISCAS, pp. 2322-2325, 2008.
Tomita et al., "1-W 3.3-16.3-V boosting wireless power transfer circuits with vector summing power controller," IEEE JSSC, vol. 47, pp. 2576-2585, Nov. 2012.
Tzuen-Hsi Huang et al., "A 1 V 2.2 mW 7 GHz CMOS quadrature VCO using current-reuse and cross-coupled transformer-feedback technology," IEEE MWCL, vol. 18, pp. 698-700, Oct. 2008.
Youngjae Lee et al., "Current reuse cross-coupling CMOS VCO using the center-tapped transformer in LC tank for digitally controlled oscillator," in IEEE RFIC, pp. 549-552, 2008.

* cited by examiner

POWER OSCILLATOR APPARATUS WITH TRANSFORMER-BASED POWER COMBINING FOR GALVANICALLY-ISOLATED BIDIRECTIONAL DATA COMMUNICATION AND POWER TRANSFER

RELATED APPLICATION

This application is a Continuation-In-Part of U.S. patent application Ser. No. 14/216,037, filed Mar. 17, 2014 which claims priority from Italian Application for Patent No. MI2013A000454, filed Mar. 26, 2013, the contents of which are hereby incorporated by reference in their entirety.

TECHNICAL FIELD

The present disclosure relates to a power oscillator apparatus with transformer-based power combining that enables bidirectional data communication on the same power channel, i.e. using the same isolation transformer for both power transfer and data communication.

BACKGROUND

It is known in the state of the art to use a circuit apparatus comprising at least two oscillators coupled by means of a proper network. The main applications of such an apparatus are the implementation of both quadrature signals and voltage-controlled oscillators with low phase-noise. For this approach, the design of the coupling network is the main issue. The coupling network may be of the active type, as disclosed in Jeong Ki Kim et al., "A current-reuse quadrature VCO for wireless body area networks," IEEE/NIH LiSSA, pp. 55-58, 2011 (the disclosure of which is incorporated by reference), or capacitive type as disclosed in Oliveira, L. B. et al., "Synchronization of two LC-oscillators using capacitive coupling," IEEE ISCAS, pp. 2322-2325, 2008 (the disclosure of which is incorporated by reference), or inductive type as disclosed in Tzuen-Hsi Huang et al., "A 1 V 2.2 mW 7 GHz CMOS quadrature VCO using current-reuse and cross-coupled transformer-feedback technology," IEEE MWCL, vol. 18, pp. 698-700, October 2008 (the disclosure of which is incorporated by reference).

Also it is known in the state of the art to use a power combining techniques to increase the overall output power in several applications. Due to technology limits, (e.g., breakdown, electro-migration constraints, thermal issues, etc.) the power level delivered by a single power stage is often below the application requirements, thus a multistage solution is required. When it comes to dc/ac conversion, transformer-based power-combining is the straight-forward solution. An example of power-combining system is disclosed in Tomita et al., "1-W 3.3-16.3-V boosting wireless power oscillator circuits with vector summing power controller," IEEE JSSC, vol. 47, pp. 2576-2585, November 2012 (the disclosure of which is incorporated by reference), where two power stages separately drive two series resonant circuits and both drivers are magnetically coupled with the secondary inductance. By controlling the phase relation between the driver's signals, the output power can effectively reach two times the power delivered by a single stage.

The use of transformer-based systems to perform data communication and/or power transfer through a galvanic barrier is known in the art. Some fields of application for such systems include industrial applications, medical devices, sensors, lighting, or any application involving galvanic isolation.

For example, systems that employ multiple transformers to create multiple isolated channels for bidirectional communication are known. While these systems are useful, they employ multiple transformers, and separate power transfer and data transfer into separate transformer links. This may increase the cost of these systems as well as the space occupied by these systems. Accordingly, further advances in transformer-based systems that perform data and power transfer through galvanic barriers are desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

One aspect of the present disclosure is to provide a power oscillator apparatus with transformer-based power combining which is able to deliver higher levels of output power with high efficiency compared to known prior art apparatus.

One aspect of the present disclosure is a power oscillator apparatus comprising: a first power oscillator and a second power oscillator arranged in series between a supply voltage and a reference voltage, an electromagnetic network for coupling the first and the second oscillator, a transformer with a primary circuit including a first portion coupled to the first oscillator and second portion coupled to the second oscillator, a circuit element for reusing the current used in the first oscillator even into the second oscillator, an output stage of the apparatus comprising a secondary circuit of the transformer, the first and the second oscillator being configured to receive a synchronizing signal for their synchronization in frequency and phase and said secondary circuit being magnetically coupled with the first and the second portion of the primary circuit to obtain an output power as combination of a first power associated to the first portion and a second power associated to the second portion of the primary circuit.

Another aspect is directed to an apparatus including first and second oscillator circuits. The apparatus also includes a transformer having a primary winding coupling the first oscillator circuit to the second oscillator circuit and a secondary winding. A first outgoing communications circuit may be coupled to the second oscillator circuit and configured to drive an amplitude modulated data signal thereto. A first incoming communications circuit may be coupled to the primary winding of the transformer. A second outgoing communications circuit may be coupled to the secondary winding and configured to drive an amplitude modulated data signal thereto. A second incoming communications circuit may be coupled to the secondary winding. The secondary winding is magnetically coupled with the primary winding such that the secondary winding receives an output power and an incoming data transmission based upon the amplitude modulated data signal, and such that the primary winding receives an incoming data transmission based upon the amplitude modulated data signal.

The primary winding may include a first winding portion coupled to the first oscillator circuit, a second winding portion coupled to the second oscillator circuit, and a center tap common to the first and second winding portions and configured to conduct current from the first oscillator into the second oscillator. The first outgoing communications circuit may be coupled to either the first or the second winding portion of the primary winding. The first incoming communications circuit may be coupled to either the first or the second winding portion of the primary winding. The first and second capacitors may be configured to detune the secondary winding.

The first outgoing communications circuit may include an encoder configured to receive a clock signal and a bitstream, and to generate a data signal based thereupon. The first outgoing communications circuit may also include a modulator coupled to the encoder and the second oscillator circuit and configured to receive the data signal from the encoder and to drive a modulated data signal based thereupon to the second oscillator circuit. A divider may be coupled to the primary winding and configured to extract therefrom a reference frequency, and the clock signal may be based upon the reference frequency.

The first incoming communications circuit may include a demodulator coupled to the primary winding and configured to receive the amplitude modulated data signal therefrom and to demodulate the amplitude modulated data signal to produce a received data signal. A decoder may be coupled to the demodulator and configured to receive the received data signal and to decode the received data signal.

The second outgoing communications circuit may include an encoder configured to receive a clock signal and a bitstream, and to generate a data signal based thereupon. The second outgoing communications circuit may also include a modulator coupled to the encoder and the secondary winding and configured to receive the data signal from the encoder and to drive a modulated data signal based thereupon to the secondary winding. A divider may be coupled to the secondary winding and configured to extract therefrom a reference frequency, and the clock signal may be based upon the reference frequency.

The second incoming communications circuit may include a demodulator coupled to the secondary winding and configured to receive the amplitude modulated data signal therefrom and to demodulate the amplitude modulated data signal to produce a received data signal. A decoder may be coupled to the demodulator and configured to receive the received data signal and to decode the received data signal.

The first and the second oscillator circuits may be configured to receive a synchronizing signal for synchronization of frequency and phase between the first and second oscillator circuits.

Another aspect is directed to an apparatus including a transformer having a primary winding and a secondary winding, and a first interface. A first outgoing communications circuit includes a first encoder coupled to the first interface and configured to receive therefrom a bitstream and a clock signal and to generate therefrom a data signal, and a first modulator coupled to the first encoder and configured to receive therefrom the data signal and coupled to the primary winding and configured to modulate the data signal and drive a modulated data signal to the primary winding. A first incoming communications circuit includes a first demodulator coupled to the primary winding and configured to receive therefrom an amplitude modulated data signal and to demodulate the amplitude modulated data signal to produce a received data signal, and a first decoder coupled to the first demodulator and configured to receive therefrom the received data signal, to decode the received data signal, and to pass a decoded data signal to the first interface. The apparatus also includes a second interface, and a second outgoing communications circuit. The second outgoing communications circuit includes a second encoder coupled to the second interface and configured to receive therefrom a bitstream and a clock signal and to generate therefrom a data signal, and a second modulator coupled to the second encoder and configured to receive therefrom the data signal and coupled to the secondary winding and configured to modulate the data signal and drive a modulated data signal to the secondary winding. A second incoming communications circuit includes a second demodulator coupled to the secondary winding and configured to receive therefrom an amplitude modulated data signal and to demodulate the amplitude modulated data signal to produce a received data signal, and a second decoder coupled to the second demodulator and configured to receive therefrom the received data signal, to decode the received data signal, and to pass a decoded data signal to the second interface. A DC/AC converter is coupled to the primary winding of the transformer and configured to transfer power to the secondary winding of the transformer. A AC/DC converter is coupled to the secondary winding of the transformer and configured to collect power from the secondary winding of the transformer. In one possible circuital implementation, the DC/AC converter is an LC resonant oscillator, whose load inductor is the primary winding of the isolation transformer, while the AC/DC converter is made up of a rectifier and may include also a voltage regulator.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification.

Figure 1:
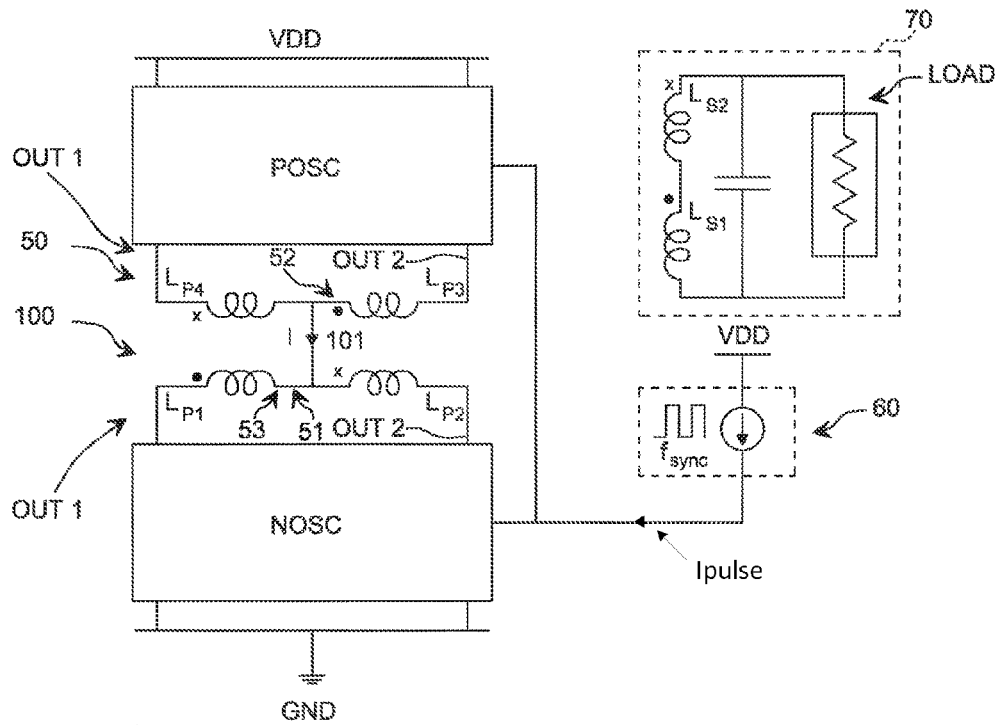
FIG. 1 shows a power oscillator apparatus according to the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, and reference numbers separated by century, as well as reference numbers with prime notation, indicate similar elements in other applications or embodiments. FIG. 1 shows a power oscillator apparatus according to the present disclosure.

The power oscillator apparatus comprises a first power oscillator POSC and a second power oscillator NOSC arranged in series between a supply voltage VDD and a reference voltage, for example ground GND.

The power oscillator apparatus comprises an electromagnetic network 100 configured to couple the oscillators POSC and NOSC each one having two output terminals OUT1, OUT2.

The power oscillator apparatus comprises a transformer 50. The primary circuit 51 comprises a first portion 52 connected to the first oscillator POSC and a second portion 53 connected to the second oscillator NOSC; the first portion 52 is connected with the output terminals OUT1, OUT2 of the first oscillator POSC while the second portion 53 is connected with the output terminals OUT1, OUT2 of the second oscillator NOSC.

The primary circuit of the transformer comprises preferably four primary winding inductors $L_{P1}$-$L_{P4}$ wherein the first portion 52 comprises two winding inductors and the second portion 53 comprises the other two winding inductors.

The power oscillator apparatus comprises a circuit element 101 to allow the reuse of the current I passing through the first oscillator even into the second oscillator NOSC; the circuit element 101 is preferably the common center tap of the first 52 and second 53 portion of the primary circuit 51 of the transformer 50.

The power oscillator apparatus receives a synchronizing signal pulse for the synchronization in frequency and phase of the first POSC and the second NOSC oscillators; the synchronizing signal Ipulse derives from a synchronizing circuit 60, preferably included in the power oscillator apparatus. The synchronization frequency $f_{sync}$ of the synchronizing signal Ipulse is equal about to $2*f_{osc}$ where $f_{osc}$ is the oscillation on frequency of the each oscillator NOSC, POSC. The synchronizing circuitry 60 forces the oscillators POSC and NOSC to operate in phase, so that the voltages applied across the winding or coils $L_{P1}$-$L_{P4}$, denoted with the same symbol (i.e., dot or cross), are at the same time all positive or all negative.

The power oscillator apparatus comprises an output stage 70 including the secondary circuit $L_{S1}$ and $L_{S2}$ of the transformer which is connectable with a load LOAD, for example a rectifier. The secondary circuit $L_{S1}$, $L_{S2}$ is magnetically coupled with the primary circuit to obtain an output power Pout which is a power combining of a first power P1 associated to the first portion 52 of the primary circuit and a second power P2 associated to the second portion 53 of the primary circuit. The transformer 50 allows the galvanic isolation between the oscillators NOSC, POSC and the output stage 70 of the power oscillator apparatus.

Figure 2:
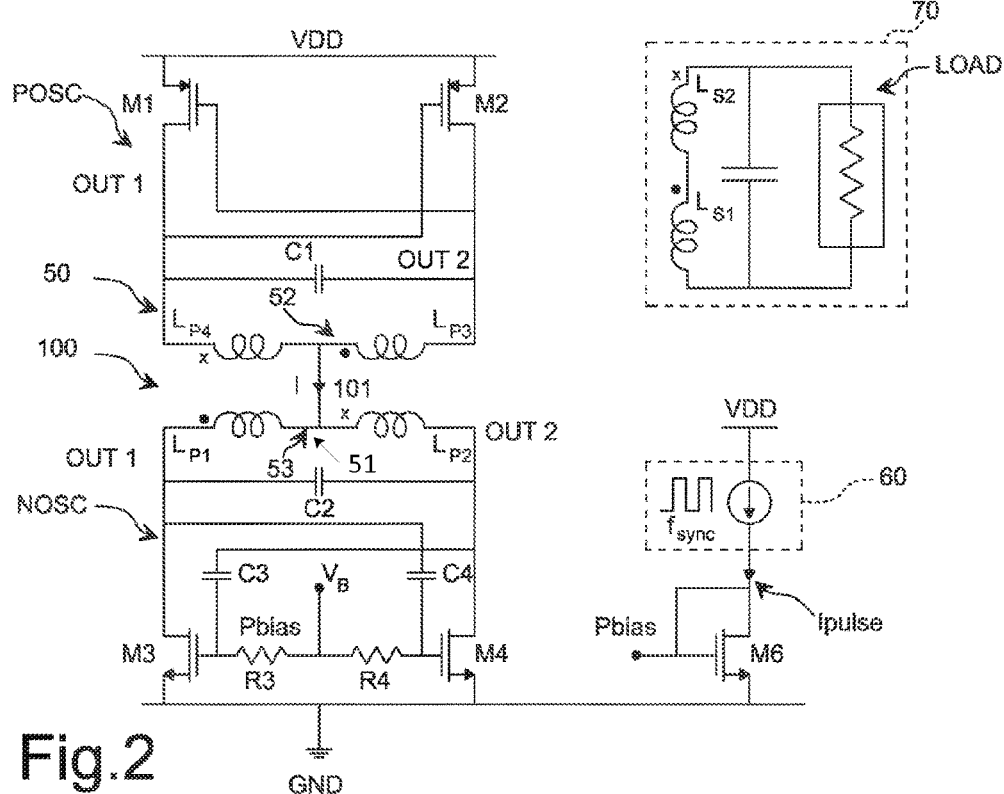
FIG. 2 shows a power oscillator apparatus according to a first embodiment of the present disclosure.

FIG. 2 shows a power oscillator apparatus according to a first embodiment of the present disclosure. The oscillators POSC and NOSC are implemented by complementary oscillators; the oscillators POSC and NOSC may be implemented in either bipolar or CMOS technologies. FIG. 2 shows the oscillators POSC and NOSC implemented in CMOS technologies.

The oscillator POSC comprises a first PMOS transistor M1 and a second PMOS transistor M2 which have the source terminals connected to the supply voltage VDD and are cross-coupled, that is the gate terminal of the transistor M1 is in common with the drain terminal of the transistor M2 and the gate terminal of the transistor M2 is in common with the drain terminal of the transistor M1.

The oscillator NOSC comprises a first NMOS transistor M3 and a second NMOS transistor M4 which have the source terminals connected to ground GND and the gate terminals connected by means of the resistances R3 and R4 with the bias voltage $V_B$ at the bias terminal Pbias. The oscillator NOSC comprises a capacitor C3 connected with the gate terminal of the transistor M3 and the drain terminal of the transistor M4 and another capacitor C4 connected with the gate terminal of the transistor M4 and the drain terminal of the transistor M3.

The electromagnetic network 100 configured to couple the oscillators POSC and NOSC is of the inductive type and comprises the primary circuit 51 of the transformer 50. The primary circuit 51 comprises the first portion 52 including the series of coils $L_{P4}$ and $L_{P3}$ associated to the oscillator POSC and the second portion 53 including the series of the coils $L_{P1}$ and $L_{P2}$ associated to the oscillator NOSC; the coupling between the oscillators POSC and NOSC is assured by the magnetic coupling of the coils $L_{P4}$ and $L_{P2}$ denoted by the symbol cross and the magnetic coupling of the coils $L_{P1}$ and $L_{P3}$ denoted by the symbol dot.

A capacitor C1 is connected between the drain terminals of the transistors M1 and M2 and forms with the coils $L_{P4}$ and $L_{P3}$ a resonant tank LC while a capacitor C2 is connected between the drain terminals of the transistors M3 and M4 and forms with the coils $L_{P1}$ and $L_{P2}$ another resonant tank LC.

The secondary circuit of the transformer 50 comprises the series of the coils $L_{S1}$ and $L_{S2}$ wherein the coil $L_{S1}$ is magnetically coupled with the coils $L_{P1}$ and $L_{P3}$ of the primary circuit and the coil $L_{S2}$ is magnetically coupled with the coil $L_{P2}$ and $L_{P4}$ of the primary circuit. The output power Pout relative to the series of the coils $L_{S1}$ and $L_{S2}$ is a power combining of each power contribution $P_{LP1}$-$P_{LP4}$ of the respective coil $L_{P1}$, $L_2$, $L_{P3}$ and $L_{P4}$ of the primary circuit 51.

When the transistor M1 is on and the transistor M2 is off the current I flows through the coils $L_{P4}$ and $L_{P2}$ and the transistor M4, while when the transistor M2 is on and the transistor M1 is off the current I flows through the coils $L_{P3}$ and $L_{P1}$ and the transistor M3. The values of inductors $L_{P1}$, $L_{P2}$, $L_{P3}$ $L_{P4}$ and capacitors C1 and C2 are related to the oscillation frequency $f_{osc}$ that is typically in the range between hundreds of megaHertz to several gigahertz. Therefore, in a typical integrated implementation of the proposed solution inductors and capacitors of a few nanoHenry and picoFarad are used, respectively.

Figure 3:
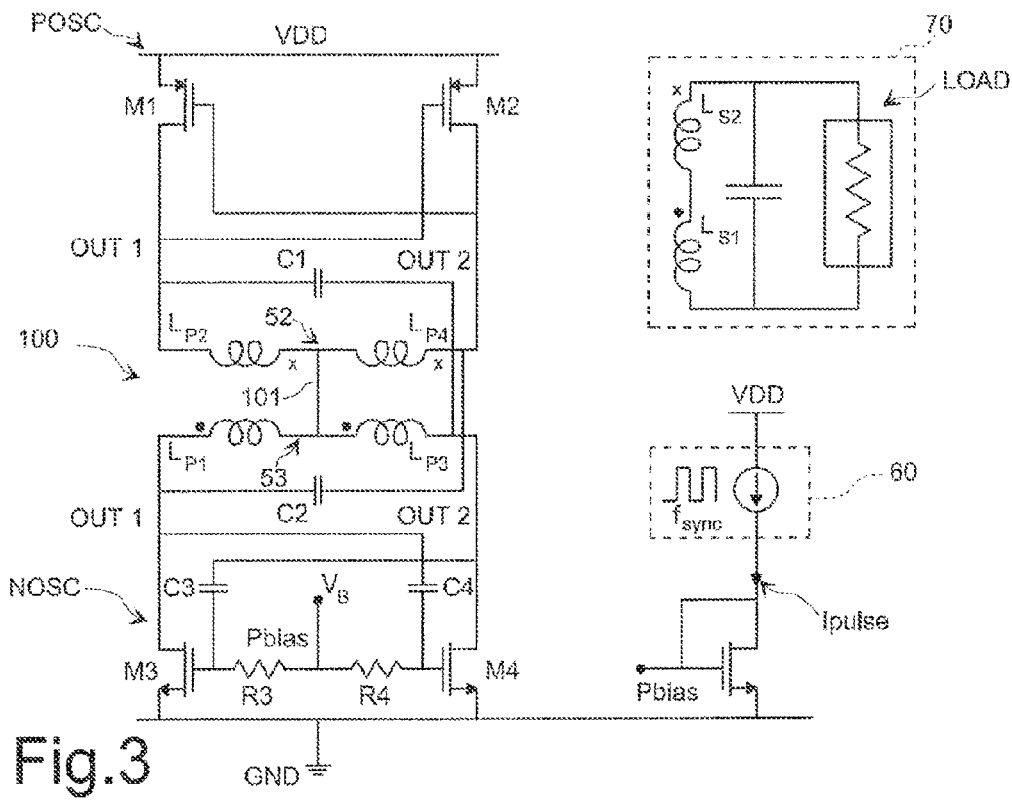
FIG. 3 shows a a power oscillator apparatus according to a second embodiment of the present disclosure.
Figure 4:
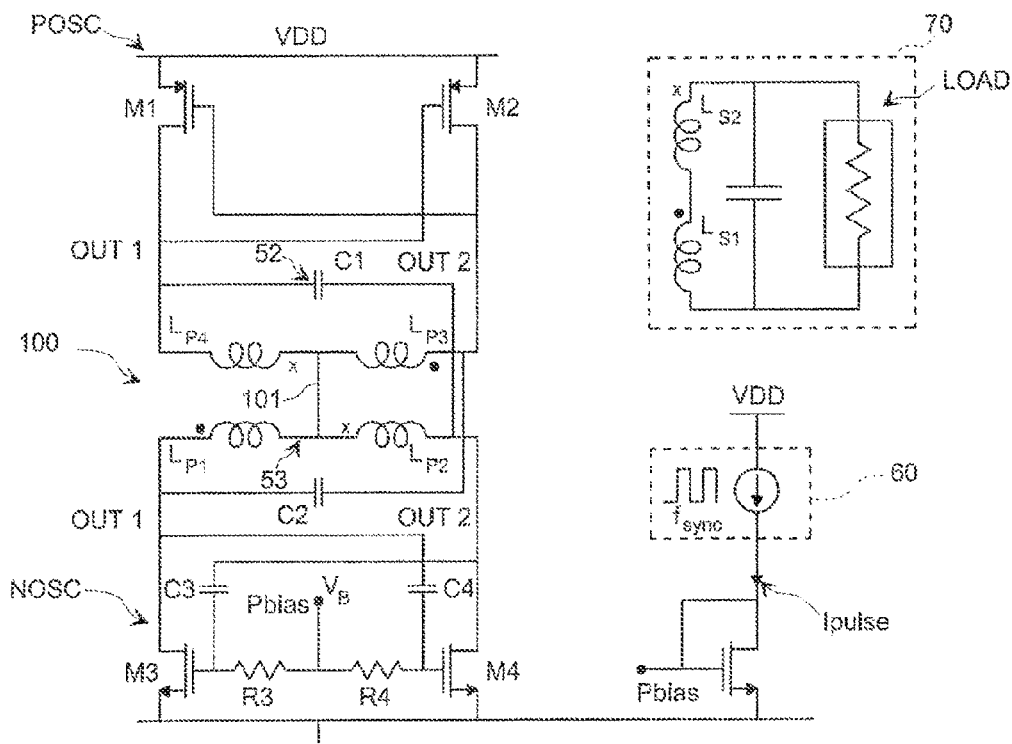
FIG. 4 shows a power oscillator apparatus according to a third embodiment of the present disclosure.
Figure 6:
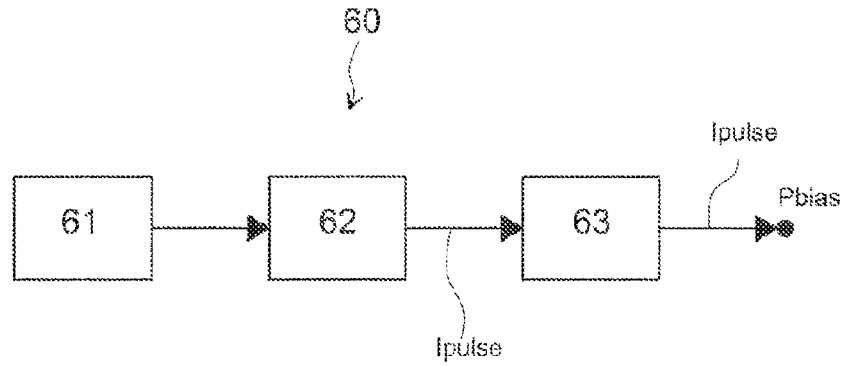
FIG. 6 shows more in detail the synchronizing circuit in FIGS. 2-4.

The synchronizing circuit 60 uses common-mode current pulses Ipulse. The current pulses are injected into the power oscillator apparatus by using a common-mode bias terminal Pbias, which can be placed in either the oscillators NOSC or POSC and which, in FIGS. 2-4, is arranged in the oscillator NOSC; preferably a NMOS transistor M6 coupled between the circuit 60 (coupled with the supply voltage VDD) and ground GND and with the gate and drain terminal in common and with the drain terminal connected with the circuit 60, allows the use of the terminal Pbias for the injection of the current pulses Ipulse. Current pulses Ipulse have a frequency $f_{sync}$ approximately equal to two times the oscillation frequency $f_{osc}$ of the oscillator POSC, NOSC; current pulses Ipulse have preferably a square-wave shape. Preferably the synchronizing circuitry 60, as shown in FIG. 6, includes a low-power low-accuracy voltage oscillator 61 (e.g., a ring oscillator), a voltage-to-current converter 62 receiving the voltage pulses output from the oscillator 61, and a current buffer 63 receiving the current pulses Ipulse, for example of 1 mA, from the converter 62 and adapted to inject the current pulses Ipulse into the bias terminal Pbias.

The presence of the synchronizing signal Ipulse of the synchronizing circuit 60 is highly suggested to avoid NOSC and POSC working at different frequency/phase, thus hindering the power-combining at the output stage 70. The synchronizing circuit 60 drives the second-harmonic (common-mode) current component to both NOSC and POSC, thus setting frequency/phase of NOSC and POSC.

The synchronization signal has no impact on the oscillator efficiency since low-value current pulses are required and synchronization is only required at the circuit start-up. Indeed, after the oscillator is locked in a stable state, it remains indefinitely in this state, regardless signal disturbance.

Figure 5:
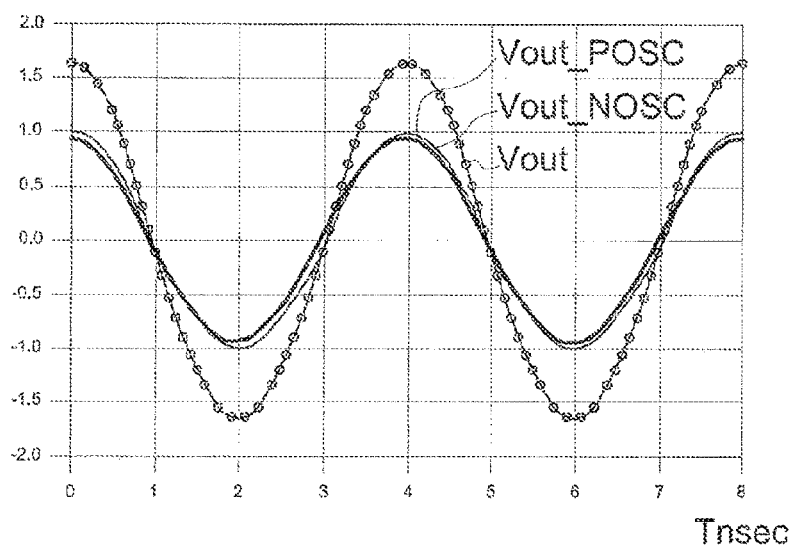
FIG. 5 shows the timing diagrams of the some voltages of the power oscillator apparatus in FIG. 2.

FIG. 5 shows a the typical waveforms of the voltages at the coils of the power oscillator apparatus in FIG. 2; Vout_NOSC is the differential voltage across the oscillator NOSC, i.e. the voltage across the series combination of $L_{P1}$ and $L_{P2}$ and Vout_POSC is the differential voltage across the oscillator POSC, i.e. the voltage across the series combination of $L_{P3}$ and $L_{P4}$ while Vout is the differential voltage across the equivalent load LOAD, i.e. the voltage across the series combination of the secondary coils $L_{S2}$ and $L_{S1}$ which is greater than the voltages Vout_POSC and Vout_NOSC but smaller than their sum.

It is clearly shown that due to the phase-relationship between Vout_NOSC and Vout_POSC, the currents forced at the primary coils are at the same time all increasing or all decreasing, and hence the fluxes generated at the primary coils. It follows that the secondary coils will catch this flux (separately, i.e. $L_{S1}$ will catch the flux generated by $L_{P1}$ and $L_{P3}$ and so on), forcing to the load a current proportional to the fluxes. At the secondary side the output voltage will be greater than Vout_NOSC or Vout_POSC, depending on the load resistance and the coupling factor between primary and secondary side, always less than one. The total power at the load LOAD is the sum of the total power applied at the primary side, except for the losses in the series resistance of the windings and the losses in the transformer substrate in case of an integrated implementation.

FIG. 3 shows a power oscillator apparatus according to a second embodiment of the present disclosure. Differently from the power oscillator apparatus in FIG. 2, the electromagnetic network 100 configured to couple the oscillators POSC and NOSC of the power oscillator apparatus in FIG. 3 is of the capacitive type; in fact the electromagnetic network 100 comprises the capacitor C1 connected between the first output terminal OUT1 of the first oscillator and the second output terminal OUT2 of the second oscillator and a second capacitor C2 connected between the second output terminal OUT2 of the first oscillator and the first output terminal OUT1 of the second oscillator, that is the capacitor C1 is connected between the drain terminal of the PMOS transistor M1 and the drain terminal of the NMOS transistor M4 and the capacitor C2 is connected between the drain terminal of the PMOS transistor M2 and the drain terminal of the NMOS transistor M3.

Differently from the power oscillator apparatus in FIG. 2, the first portion 52 of the primary circuit 51 of the transformer 50 comprises the series of the coils $L_{P2}$ and $L_{P4}$ connected between the drain terminals of the PMOS transistors M1 and M2 and the second portion 53 of the primary circuit 51 comprises the series of the coils $L_{P1}$ and $L_{P3}$ connected between the drain terminals of the NMOS transistors M3 and M4.

The secondary circuit of the transformer 50 comprises the series of the coils $L_{S1}$ and $L_{S2}$ wherein the coil $L_{S1}$ is magnetically coupled with the coils $L_{P1}$ and $L_{P3}$ of the primary circuit and the coil $L_{S2}$ is magnetically coupled with the coils $L_{P2}$ and $L_{P4}$ of the primary circuit. The output power Pout relative to the series of the coils $L_{S1}$ and $L_{S2}$ is a power combining of each power contribution $P_{LP1}$-$P_{LP4}$ of the respective coil $L_{P1}$, $L_{P2}$, $L_{P3}$ and $L_{P4}$ of the primary circuit 51.

FIG. 4 shows a power oscillator apparatus according to a third embodiment of the present disclosure. Differently from the power oscillator apparatus in FIG. 2, the electromagnetic network 100 configured to couple the oscillators POSC and NOSC of the power oscillator apparatus in FIG. 3 is of the capacitive and inductive type; in fact the electromagnetic network 100 comprises the capacitor C1 connected between the first output terminal OUT1 of the first oscillator POSC and the second output terminal OUT2 of the second oscillator NOSC and a second capacitor C2 connected between the second output terminal OUT2 of the first oscillator and the first output terminal OUT1 of the second oscillator, that is the capacitor C1 is connected between the drain terminal of the PMOS transistor M1 and the drain terminal of the NMOS transistor M4 and the capacitor C2 is connected between the drain terminal of the PMOS transistor M2 and the drain terminal of the NMOS transistor M3.

Also the electromagnetic network 100 comprises the primary circuit 51 of the transformer 50. The electromagnetic network 100 includes the series of coils $L_{P4}$ and $L_{P3}$ associated with the oscillator POSC, that is connected to the output terminals OUT1 and OUT2 of the oscillator POSC, and the series of the coils $L_{P1}$ and $L_{P2}$ associated with the oscillator NOSC, that is connected to the output terminals OUT1 and OUT2 of the oscillator NOSC. The coupling between the oscillators POSC and NOSC is assured by the magnetic coupling of the coils $L_{P4}$ and $L_{P2}$ denoted by the symbol cross and the magnetic coupling of the coils $L_{P1}$ and $L_{P3}$ denoted by the symbol dot.

For all the embodiments in FIGS. 2-4, the transformer topology comprises two separated magnetic circuits, whose common fluxes are marked by dots (i.e., $L_{P1,3}$ with $L_{S1}$) and crosses (i.e., $L_{P2,4}$ with $L_{S2}$), respectively. Dots and crosses are placed according to the common flux conventions.

Figure 7:
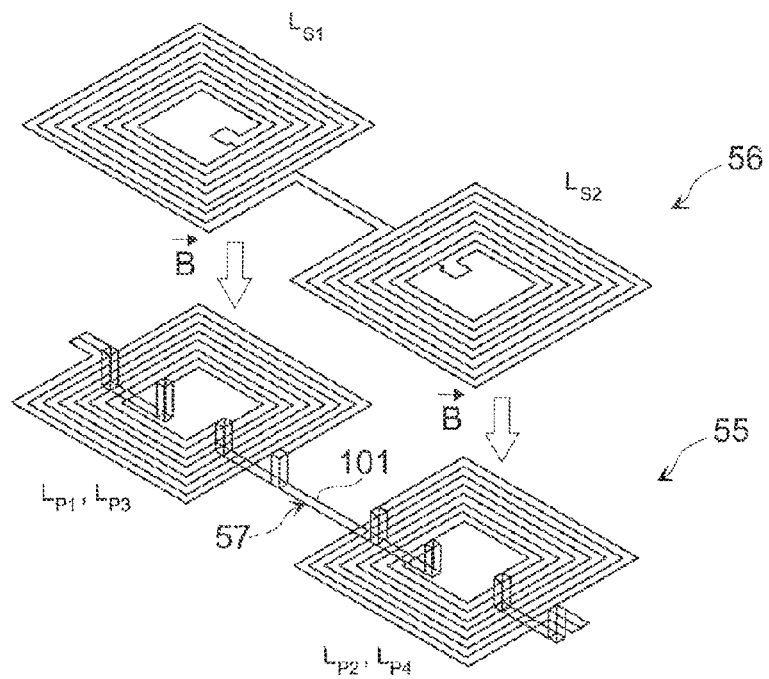
FIG. 7 is a schematic tridimensional view of an implementation of the structure of the transformer of FIG. 2.
Figure 8:
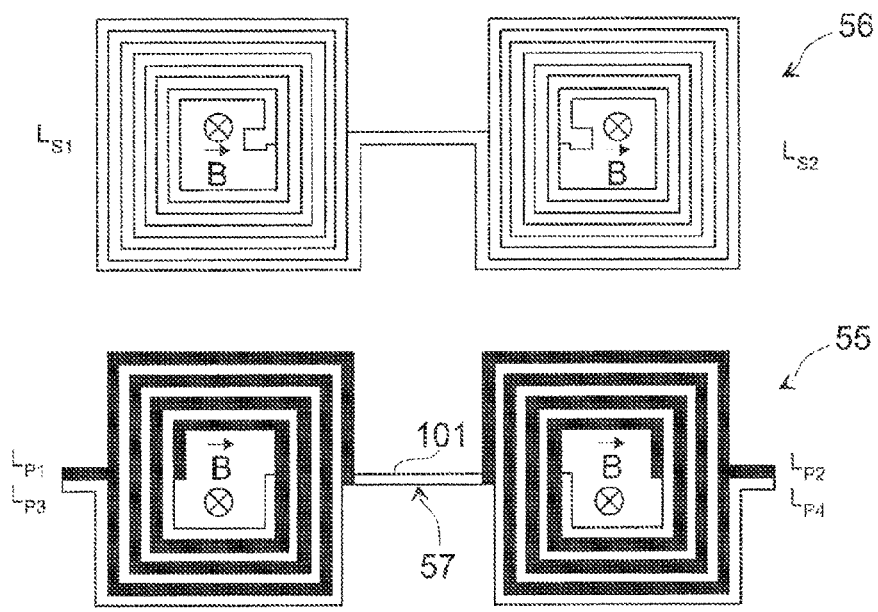
FIG. 8 is schematic planar view of the implementation of the structure of the transformer of FIG. 7.

In accordance with the power oscillator apparatus of the present disclosure it is possible to build an integrated circuit comprising the power oscillator apparatus as shown in each one of the FIGS. 1-4. The integrated circuit shows a physical monolithic implementation for the transformer 50 using only three metal layers. FIG. 7 shows a schematic tridimensional view of the structure of the transformer 50 while FIGS. 8-11 show schematic planar views of primary $L_{P1}$-$L_{P4}$ and secondary $L_{S1}$, $L_{S2}$ windings. FIG. 8 is the planar view of transformer 50 related to the tridimensional view of FIG. 7. A stacked arrangement for the transformer 50 comprises the primary coils $L_{P1}$-$L_{P4}$ performed in the mid-level or intermediate metal layer 55 and the secondary coils $L_{S1}$, $L_{S2}$ performed in the top metal layer 56; preferably the primary coils $L_{P1}$-$L_{P4}$ and the secondary coils $L_{S1}$, $L_{S2}$ are provided in the form of metal spirals. The common center tap 101 may be formed in the bottom metal layer 57 or in the intermediate metal layer 55. The integrated circuit is formed in a chip of semiconductor material and the transistors M1-M4 and the other elements of the oscillators POSC and NOSC except the transformer 50 are formed according to the known technology.

The four inductors $L_{P1}$-$L_{P4}$ of the primary coils are arranged using two symmetric interleaved configurations, one for each secondary coupled coils $L_{S1}$, $L_{S2}$, with a common terminal for the center-tap 101. Underpasses are formed in the bottom metal layer 57 and are only used to contact the inductors terminals and preferably the center-tap 101. Secondary coils $L_{S1}$, $L_{S2}$ are stacked on top of primary coils $L_{P1}$-$L_{P4}$ and series-connected to build the secondary winding. Their inner terminals are contacted by bonding wires. The primary coils $L_{P1}$, $L_{P3}$ (with the winding $L_{P1}$ in black and the winding $L_{P3}$ in white) are arranged in a interleaved configuration under the secondary coil $L_{S1}$ and the primary coils $L_{P2}$, $L_{P4}$ (with the winding $L_{P2}$ in black and the winding $L_{P4}$ in gray) are arranged in a interleaved configuration under the secondary coil $L_{S2}$.

The stacked configuration between primary and secondary windings is inherently suitable to obtain galvanic isolation, provided that suitable dielectric layer between the intermediate metal layer 55 and the top metal layer 56 is used. For the sake of clarity, FIGS. 7-11 are only an example of implementation. Indeed, the shape, the number of turns and the turn ratio between primary and secondary windings may vary. Moreover, if more metal layers are available, multi-layer shunt-connected spirals can be exploited to reduce the series resistances of the coils. Patterned ground shields can be implemented below the primary windings to reduce substrate losses if necessary.

Figure 9:
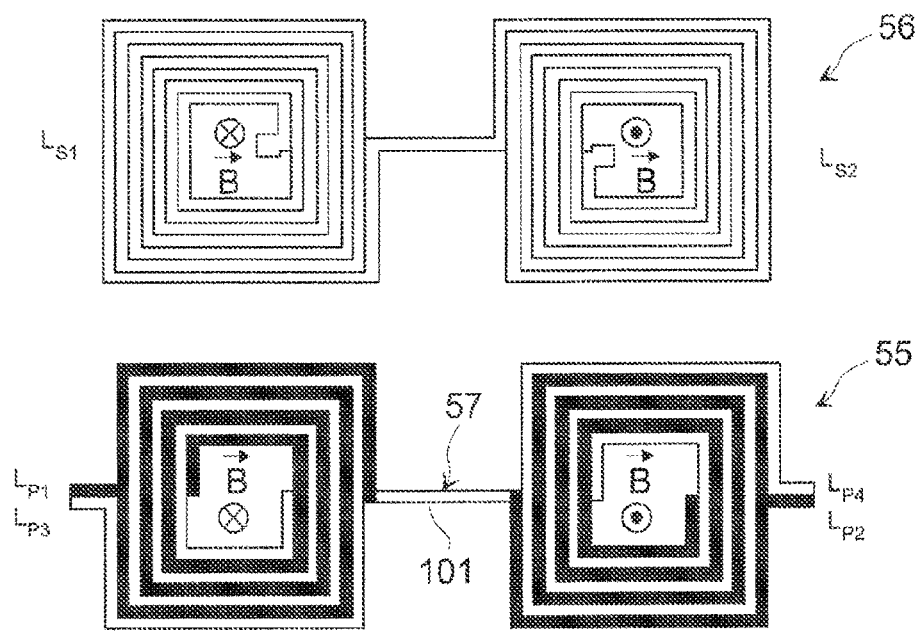
FIG. 9 is schematic planar view of another implementation of the structure of the transformer of FIGS. 2 and 3.

For both schematics in FIGS. 2 and 3, an alternative implementation of the transformer is reported in the planar view in FIG. 9. It mainly differs from the one shown in FIG. 8 for the magnetic fields B that are in opposite phase between coils at the left side, $L_{P1}$, $L_{P3}$ and $L_{S1}$, and the right side, $L_{P2}$, $L_{P4}$ and $L_{S2}$, of the structure. This configuration allows lower electromagnetic interferences to be achieved.

Figure 10:
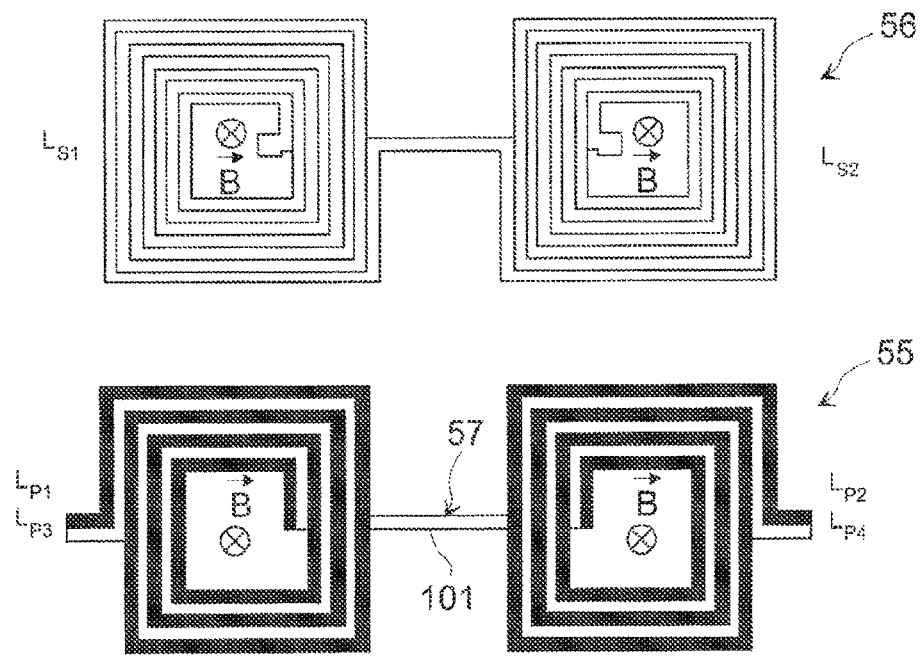
FIG. 10 is schematic planar view of an implementation of the structure of the transformer of FIG. 4.
Figure 11:
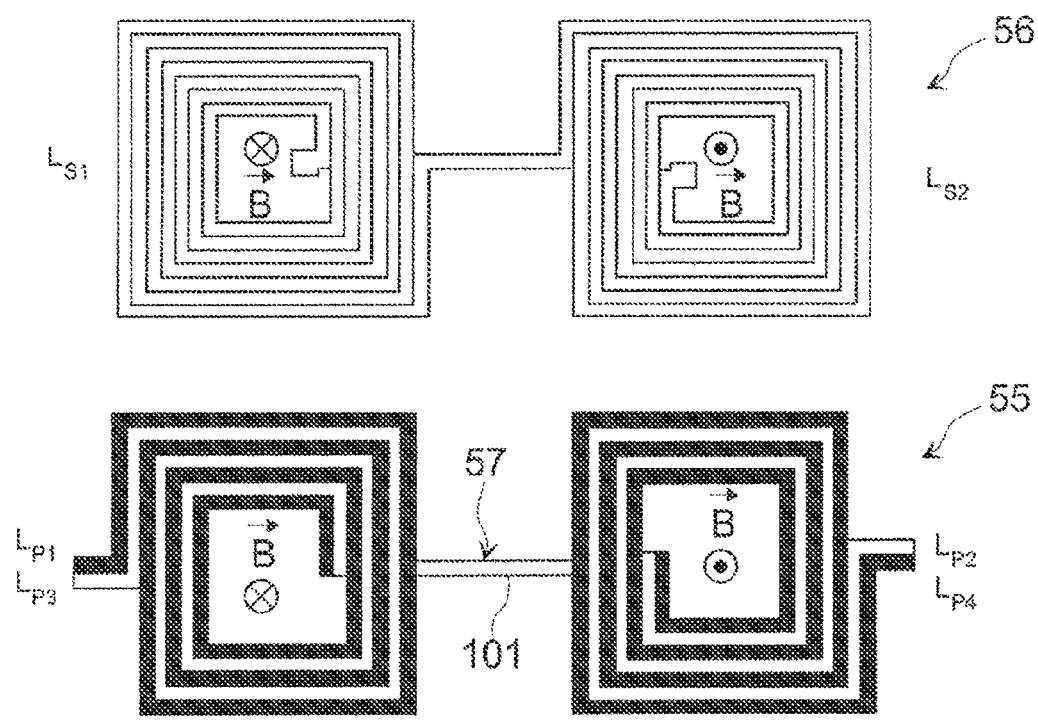
FIG. 11 is schematic planar view of another implementation of the structure of the transformer of FIG. 4.

For the schematic in FIG. 4 two alternative implementations of the transformer 50 are shown in FIGS. 10 and 11. These implementations use two different interleaved transformers at the primary side, while the secondary is the same as the previous solutions in FIGS. 8 and 9, respectively. FIG. 10 shows the primary coils $L_{P1}$, $L_{P3}$ arranged in an interleaved configuration under the secondary coil $L_{S1}$ and the primary coils $L_{P2}$, $L_{P4}$ arranged in an interleaved configuration under the secondary coil $L_{S2}$ with the magnetic fields B that are in phase between the coils while FIG. 11 shows the primary coils $L_{P1}$, $L_{P3}$ arranged in an interleaved configuration under the secondary coil $L_{S1}$ and the primary coils $L_{P2}$, $L_{P4}$ (with the winding $L_{P2}$ in white and the winding $L_{P4}$ in black) arranged in an interleaved configuration under the secondary coil $L_{S2}$ with the magnetic fields B that are in opposite phase between coils at the left side, $L_{P1}$, $L_{P3}$ and $L_{S1}$, and the right side, $L_{P2}$, $L_{P4}$ and $L_{S2}$, of the structure.

Compared to the implementations in FIGS. 8 and 9 this arrangement needs only one underpass.

Compared to the typical apparatuses, the power oscillator apparatus shown in FIG. 1-11 is able to deliver higher levels of power, while providing higher efficiency. Indeed, it is able to overcome the limitations of the oscillating voltage due to the breakdown voltage thanks to a transformer-based power combining technique. The efficiency is further increased thanks to the current-reuse approach. Finally, the mixed stacked-interleaved configuration that is proposed for the transformer implementation allows low-area consumption to be achieved. The transformer structure is inherently suited for (integrated) galvanic isolation, provided that a proper dielectric layer is used. Moreover, it is easy to obtain a high voltage boosting ratio between the secondary and the primary side by taking advantage of the number of turn ratio.

It is worth noting that when inductive coupling is adopted between primary coils, as in the configurations shown in FIGS. 2, 3 and 4, the equivalent resonator inductance, $L_{eq}$ is increased according to the following expression:

$$L_{eq} = (L_{P1,3} + L_{P2,4}) \cdot (1 + k_P)$$

where $k_P$ is the magnetic coupling factor between the primary coils. This achievement allows obtaining a significant area reduction compared to no-coupled coils. The proposed embodiment can be implemented in different approaches: in a monolithic solution, using a post-processing for the dielectric and the secondary coil, using two face-to-face dice with a post-processing for the dielectric, as the approach described in United State Patent Application Publication No. 2012/0256290 (incorporated herein by reference) or using a system-in-package approach with a post-processed transformer according to the Analog Device Inc. isoPower® technology.

A non-limiting design implementation of the apparatus shown in FIG. 2 is reported below for a typical 0.35-µm CMOS process. Considering $f_{osc}$=250 MHz, $f_{sync}$=500 MHz, Ipulse=1.5 mA, VDD=3 V, $L_{P1}$=$L_{P2}$=$L_{P3}$=$L_{P4}$=5 nH, $L_{S1}$=$L_{S2}$=10 nH, $k_{P1,3}$=$k_{P2,4}$=$k_P$=0.6 (i.e., magnetic coupling factor between primary coils 51), $k_{P1,3-S1}$=$k_{P2,4-S2}$=0.8 (i.e., magnetic coupling factor between primary coils 51 and secondary coils in the output stage 70), C1=C2=17 pF (excluding the parasitic capacitor of active devices M1-M4), C3=C4=10 pF, LOAD=60Ω, R3=R4=1 kΩ. The circuit behavior can be explained as the superposition of two in-phase oscillators i.e., NOSC and POSC) in which, as in classical cross-coupled topologies, transistors M1-M2 and M3-M4 provide the non-linear negative conductance required to sustain the steady-state oscillation. The cross-coupled connection in the NOSC is guaranteed by the high-pass RC circuit formed by R3-C3 and R4-C4, respectively, thus allowing a bias terminal Pbias to be available for the connection of the biasing/synchronization circuitry. The oscillator resonant tanks are the LC parallel networks made up by $L_{P1}$, $L_{P2}$, C1 and $L_{P3}$, $L_{P4}$, C2 for the NOSC and POSC, respectively. The tanks are tuned at about $f_{osc}$ and therefore the differential voltage waveforms at the output terminals (i.e., OUT1 and OUT2) of each oscillator are forced to be almost sinusoidal at $f_{osc}$. The presence of magnetic couplings between primary coils 51, increases the equivalent inductance according to the following expression: $L_{eq}=(L_{P1,3}+L_{P2,4})\cdot(1+k_P)$. The phase-relationship between Vout_NOSC (i.e., the voltage between the terminals OUT1-OUT2 of the oscillator NOSC) and Vout_POSC (the voltage between the terminals OUT1-OUT2 of the oscillator POSC) is due to the primary coupling configuration, as well as the common-mode synchronizing signal at $f_{sync}$ (i.e., at 2 times $f_{osc}$). Therefore, the currents forced at the primary coils are at the same time all increasing or all decreasing, and hence the fluxes generated at the primary coils. It follows that the secondary coils will catch this flux (separately, i.e. $L_{S1}$ will catch the flux generated by $L_{P1}$ and $L_{P3}$ and so on), forcing to the load a current proportional to the fluxes. At the secondary side the output voltage will be greater than Vout_NOSC or Vout_POSC. The total power at the load is the sum of the total power applied at the primary side, except for the losses in the series resistance of the windings and the losses in the transformer substrate in case of an integrated implementation.

To deliver high level of power with high efficiency, transistors M1-M4 have to work as switches with very low on resistances. Moreover, the loss reduction in the transformer is highly related to the availability of low-resistance metal layers (55, 56 and 57) to obtain high quality-factor coils.

The power oscillator apparatus described above may also be used to transmit data. Such an embodiment is now described with initial reference to FIG. 12.

The power oscillator apparatus is similar to that described with reference to FIGS. 1-2, and some details described above are therefore omitted for brevity. The power oscillator apparatus includes a transformer 50 having a primary winding 51 and a secondary winding 300.

A first outgoing communications circuit 210 is coupled between the primary winding 51 and a first interface 200, and serves to encode, modulate, and prepare for transmission data across the galvanic barrier at speeds on the order of hundreds of kilobits. A first incoming communications circuit 212 is coupled between the primary winding 51 and the first interface 200, and serves to receive, demodulate, and decode data transmitted from across the galvanic barrier. The first interface 200 delivers a clock signal CLK IN and a LS BITSTREAM to the first outgoing communications circuit 210 to be used for the transmission of the data across the galvanic barrier, and receives the clock signal CLK OUT and the HS BITSTREAM from the first incoming communications circuit 212. It should be appreciated that the communications are half-duplex, and that the first outgoing communications circuit 210 and the first incoming communications circuit 212 are therefore not active at the same time. Also, the CLK IN and CLK OUT signals are not related.

Figure 13:
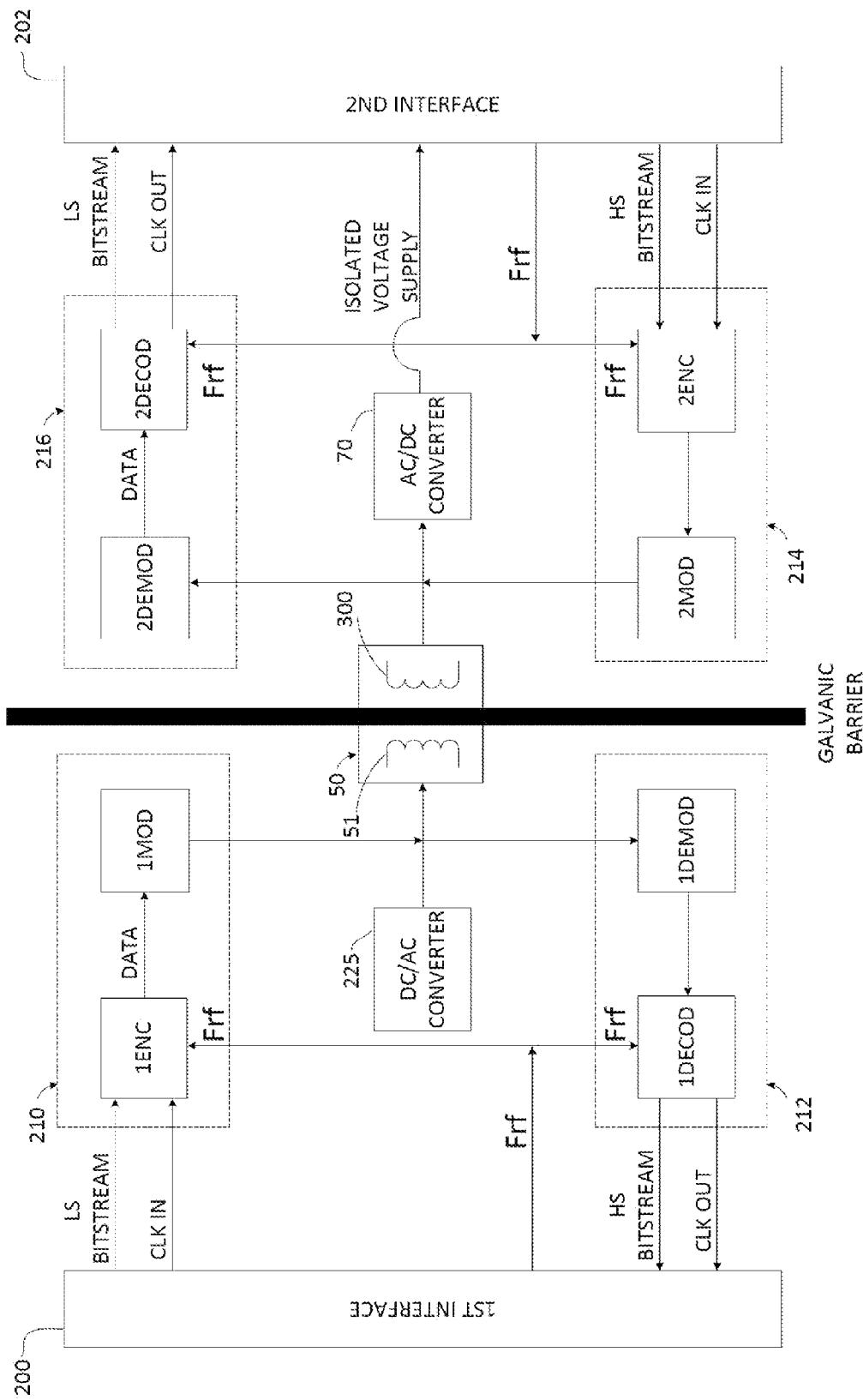
FIG. 13 shows an apparatus similar to that of FIG. 12 but without frequency dividers.

A DC/AC converter 225 is coupled to the primary winding 51 to effectuate power transfer, and ultimately data transfer, to the secondary winding 300. An optional divider 220 is coupled between the DC/AC converter 225 and the primary winding 51, and serves to extract a reference frequency Frf to be used by the first incoming communications circuit 212 and first outgoing communications circuit 210 for decoding and encoding. The reference frequency Frf may be used by the first interface 200 in generating the clock signal CLK IN. An embodiment wherein the divider 220 is not present is shown in FIG. 13.

Referring again to FIG. 12, the first outgoing communications circuit 210 includes a first encoder 1ENC coupled to the first interface 200 to receive therefrom the bitstream LS BITSTREAM and the clock signal CLK IN, and to generate therefrom data signal to be passed to a first modulator 1MOD coupled thereto. The first modulator 1MOD receives the data signal and modulates the data signal, via amplitude modulation, such that it can be driven to the secondary winding 300 by the primary winding 51.

The first incoming communications circuit 212 includes a first demodulator 1DEMOD coupled to the primary winding 51 to receive therefrom an amplitude modulated data signal and demodulates the amplitude modulated data signal to produce a received data signal. A first decoder 1DECOD is coupled to the first demodulator 1DEMOD to receive therefrom the received data signal, and decodes the received high speed data signal and passes a resulting decoded high speed data signal HS BITSTREAM to the first interface 200 together with the clock signal CLK OUT.

A AC/DC converter 70, such as a rectifier/regulator is coupled to the secondary winding 300 and is powered by the power transferred from the DC/AC converter 225, across the galvanic barrier, via the primary winding 51. The AC/DC converter 70 outputs an isolated voltage supply to the second interface 202.

A second outgoing communications circuit 214 is coupled between a second interface 202 and the secondary winding 300, and serves to encode, modulate, and prepare the data for transmission across the galvanic barrier at speeds on the order of tens of megabits. A second incoming communications circuit 216 is coupled between the second interface 202 and the secondary winding 300, and serves to receive, demodulate, and decode the data transmitted across the galvanic barrier. The second interface 202 delivers the clock signal and the bitstream to the second outgoing communications circuit 214 to be used for the transmission of the data across the galvanic barrier, and receives the clock signal and the data from the second outgoing communications circuit 214.

The second outgoing communications circuit 214 includes a second encoder 2ENC coupled to the second interface 202 to receive therefrom the bitstream HS BITSTREAM and a clock signal CLK IN, and generates therefrom a data signal. A second modulator 2MOD is coupled to the second encoder 2ENC to receive therefrom the data signal and modulates the data signal, via amplitude modulation, into a modulated data signal to be driven to the secondary winding 300 for transmission across the galvanic barrier.

The second incoming communications circuit 216 includes a second demodulator 2DEMOD coupled to the secondary winding 300 to receive therefrom an amplitude modulated data signal and demodulates the amplitude modulated data signal to produce a received data signal. A second decoder 2DECOD is coupled to the second demodulator 2DEMOD to receive therefrom the received data signal, and decodes the received data signal into a decoded data signal to be passed to the second interface 202.

An optional divider 221 is coupled between the secondary winding 300 and the second interface 202, and serves to extract a reference frequency Frf to be used by the second incoming communications circuit 216 and second outgoing communications circuit 214 for decoding and encoding. Shown in FIG. 13 is an embodiment wherein the optional divider 221 is not present.

The circuits described above with reference to FIG. 12 allow the transfer of power and data across a galvanic barrier, using the same transformer. This reduces the complexity and cost as compared to conventional circuits.

Figure 12:
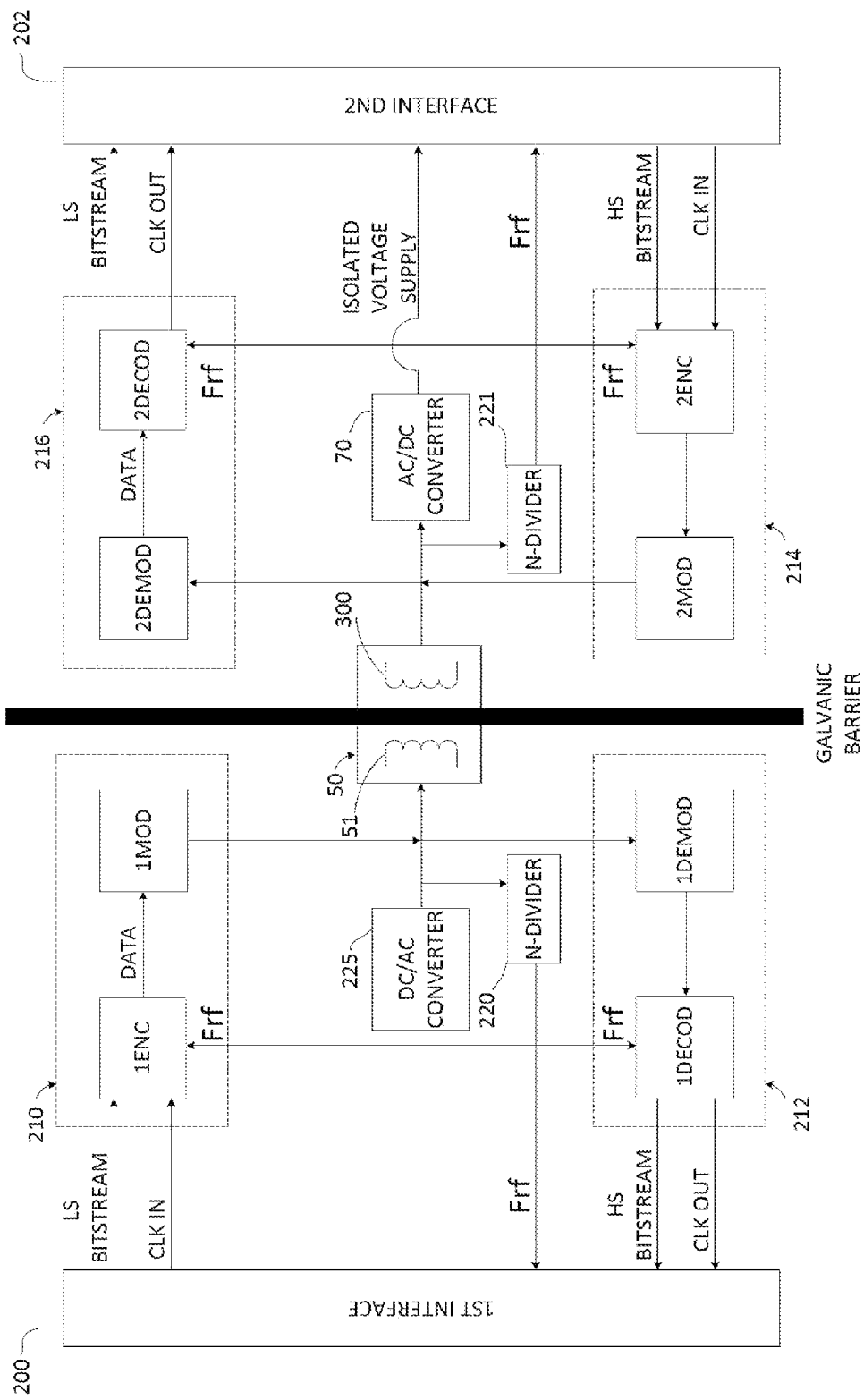
FIG. 12 shows an apparatus according to the present disclosure that transmits data and power across a galvanic barrier.

The system in FIG. 12 is a general scheme that can be used in different application fields. Typically, interface 200 is a microcontroller, while interface 202 is an isolated front-end e.g., isolated RS-485 transceivers, isolated CAN transceivers, isolated RS-232 transceivers, isolated I2C transceivers, isolated ADC, isolated USB transceivers, etc.

Figure 14:
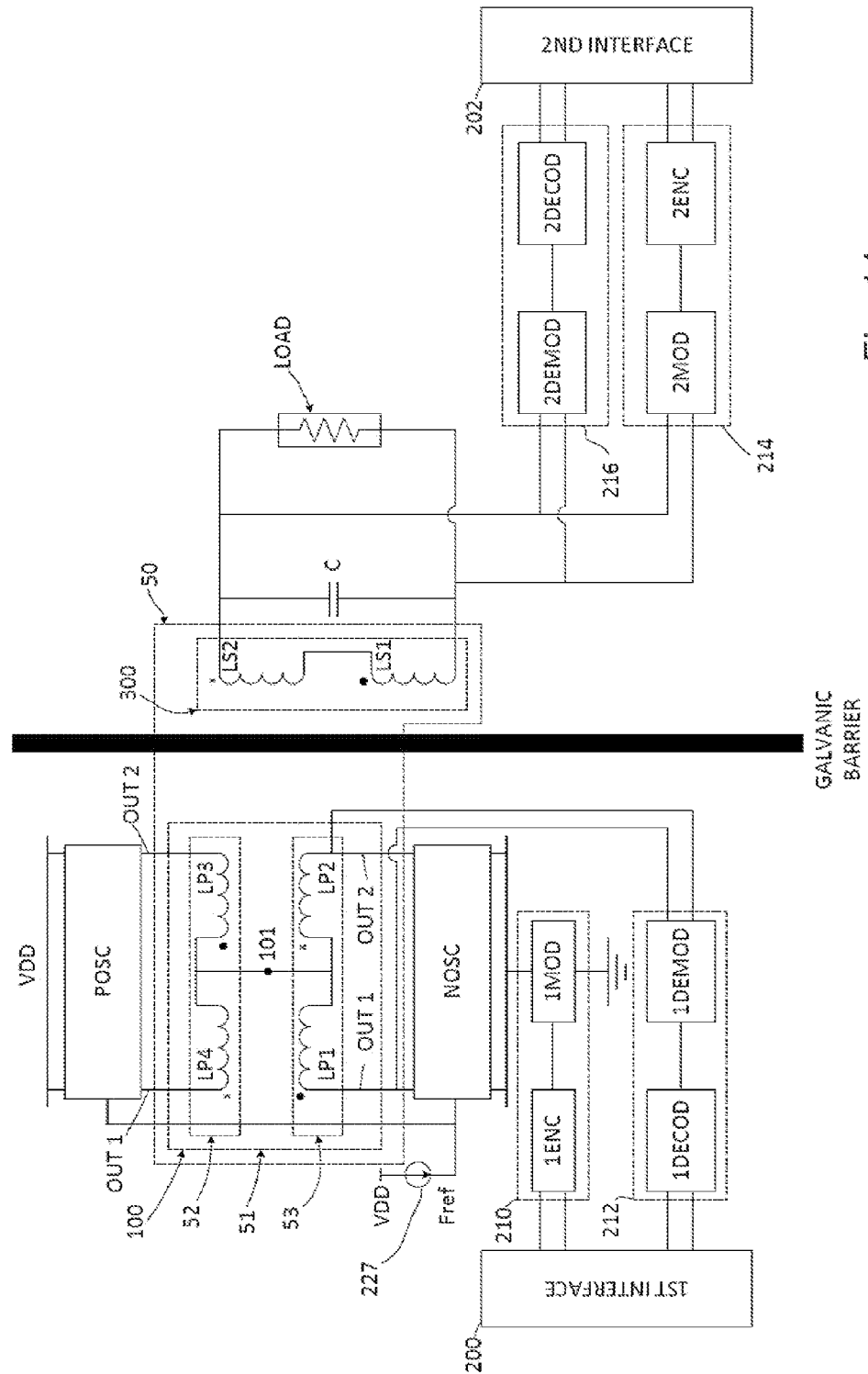
FIG. 14 shows a power oscillator apparatus according to the present disclosure that transmits data and power across a galvanic barrier.

Further possible implementation details are now described with reference to FIG. 14. Here, the primary winding 51 includes a first winding portion 52 coupled to a first oscillator circuit POSC, and a second winding portion 53 coupled to a second oscillator circuit NOSC. The first winding portion includes windings LP3 and LP4, while the second winding portion includes windings LP1 and LP2. The first winding portion 52 and second winding portion 53 are coupled together via a common center tap 101. The primary winding 100 is magnetically coupled to a secondary winding 300 for purposes of power transfer. In addition, here Fref is generated by a signal generator 227.

A load LOAD and load capacitor C are coupled to the secondary winding 300, and receive the power transferred from the primary winding 51 to the secondary winding 300 across the galvanic barrier. The RC load is the simplified model for the AC/DC converter (e.g., a rectifier) that performs the AC-DC conversion.

The operation of the first and second oscillator circuits, as well as the transformer 50, with respect to the transfer of power are the same as described above with reference to FIG. 1 and no further description is needed.

Figure 15:
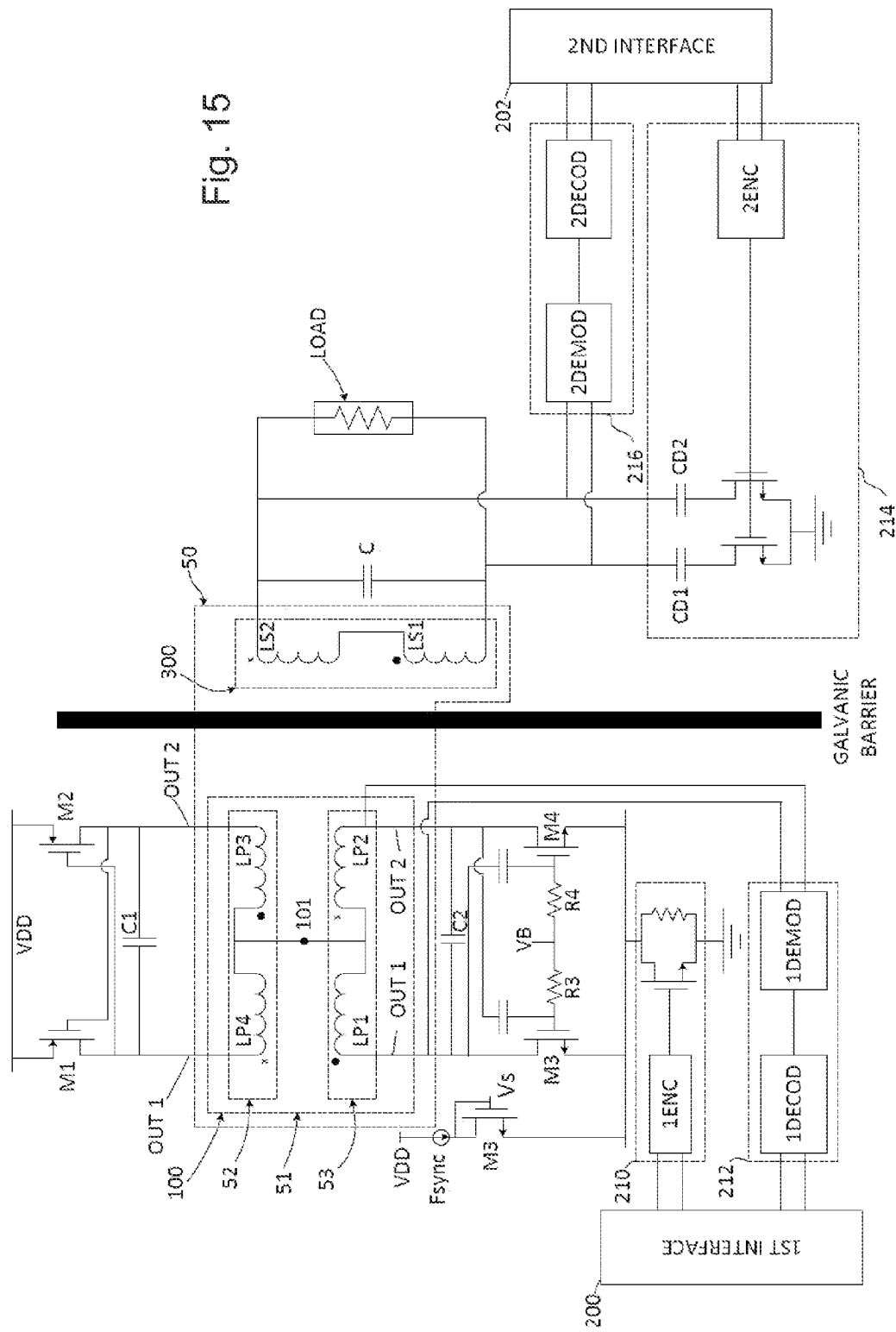
FIG. 15 shows further details of a power oscillator apparatus according to the present disclosure that transmits data and power across a galvanic barrier.

Yet further possible implementation details are now described with reference to FIG. 15. Here, the modulators of the first and second outgoing communications circuits 210, 214 are replaced with conventional transistor circuits. The first oscillator circuit is replaced with transistors M1, M2 that have their sources tied to a voltage supply VDD, and their drains tied together through a capacitor C1. The gate of transistor M1 is coupled to the drain of the transistor M2, and the gate of the transistor M2 is coupled to the drain of the transistor M1.

The second oscillator circuit is replaced with transistors M3, M4, that have their sources tied to a reference voltage, and the drains tied together through a capacitor C2. The gates of the transistors M3, M4 are coupled through resistors R3, R3. In addition, the gate of the transistor M3 is coupled to the drain of the transistor M4, while the gate of the transistor M4 is coupled to the drain of the transistor M3.

The modulator 1MOD is implemented by an NMOS switch with a parallel resistor, whose value is related to the modulation depth.

The modulator 2MOD is implemented by NMOS switches which shunt to ground the detuning capacitors CD1 and CD2. These capacitors are used to detune the secondary winding of the isolation transformer 50, i.e. they change the reactive part of the impedance (as happens with the backscattering in a RFID), thus producing an amplitude modulation at the primary windings (i.e., OUT1, OUT2).

The operation of the first and second oscillator circuits, as well as the transformer 50, with respect to the transfer of power are the same as described above with reference to FIG. 2 and no further description is needed.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An apparatus, comprising:
   a first oscillator circuit;
   a second oscillator circuit;
   a transformer having:
      a primary winding coupling the first oscillator circuit to the second oscillator circuit, and
      a secondary winding;
   an outgoing communications circuit coupled to the second oscillator circuit and configured to drive an amplitude modulated data signal thereto;
   an incoming communications circuit coupled to the secondary winding;
   the secondary winding being magnetically coupled with the primary winding such that:
      the secondary winding receives an output power and an incoming data transmission based upon the amplitude modulated data signal.

2. The apparatus of claim 1, wherein the primary winding comprises:
   a first winding portion coupled to the first oscillator circuit;
   a second winding portion coupled to the second oscillator circuit; and
   a center tap common to the first and second winding portions and configured to conduct current from the first oscillator into the second oscillator;
   wherein the outgoing communications circuit is coupled to the second winding portion of the primary winding; and
   wherein the incoming communications circuit is coupled to the second winding portion of the primary winding.

3. The apparatus of claim 1, wherein the outgoing communications circuit comprises:
   an encoder configured to receive a clock signal and a bitstream, and to generate a data signal based thereupon; and
   a modulator coupled to the encoder and the second oscillator circuit and configured to receive the data signal from the encoder and to drive a modulated data signal based thereupon to the second oscillator circuit.

4. The apparatus of claim 3, further comprising a divider coupled to the primary winding and configured to extract therefrom a reference frequency; and wherein the clock signal is based upon the reference frequency.

5. The apparatus of claim 1, further comprising:
   a demodulator coupled to the secondary winding and configured to receive the amplitude modulated data signal therefrom and to demodulate the amplitude modulated data signal to produce a received data signal;
   a decoder coupled to the demodulator and configured to receive the received data signal and to decode the received data signal.

6. The apparatus of claim 1, wherein the first and the second oscillator circuits are configured to receive a synchronizing signal for synchronization of frequency and phase between the first and second oscillator circuits.

7. The apparatus of claim 1, wherein the incoming communications circuit comprises:
   a demodulator coupled to the secondary winding and configured to receive the amplitude modulated data signal therefrom and to demodulate the amplitude modulated data signal to produce a received data signal; and
   a decoder coupled to the demodulator and configured to receive the received data signal and to decode the received low speed data signal.

8. The apparatus of claim 7, wherein the first and the second oscillator circuits are configured to receive a synchronizing signal for synchronization of frequency and phase between the first and second oscillator circuits.

9. An apparatus, comprising:
   a first oscillator circuit;
   a second oscillator circuit;
   a transformer having:
      a primary winding coupling the first oscillator circuit to the second oscillator circuit, and
      a secondary winding;
   an incoming communications circuit coupled to the primary winding of the transformer;
   an outgoing communications circuit coupled to the secondary winding and configured to drive an amplitude modulated data signal thereto; and
   the secondary winding being magnetically coupled with the primary winding such that:
      the secondary winding receives an output power, and
      the primary winding receives an incoming data transmission based upon the amplitude modulated data signal.

10. The apparatus of claim 9, wherein the primary winding comprises:
   a first winding portion coupled to the first oscillator circuit;
   second winding portion coupled to the second oscillator circuit; and
   a center tap common to the first and second winding portions and configured to conduct current from the first oscillator into the second oscillator;
   wherein the outgoing communications circuit is coupled to the second winding portion of the primary winding; and wherein the incoming communications circuit is coupled to the second winding portion of the primary winding.

11. The apparatus of claim 9, wherein the incoming communications circuit comprises:
   a demodulator coupled to the primary winding and configured to receive the amplitude modulated data signal therefrom and to demodulate the amplitude modulated data signal to produce a received data signal; and
   a decoder coupled to the demodulator to receive the received data signal therefrom and to decode the received data signal.

12. The apparatus of claim 9, wherein the outgoing communications circuit comprises:
   an encoder configured to receive a clock signal and a bitstream, and to generate a data signal based thereupon; and
   a modulator coupled to the encoder and the secondary winding and configured to receive the data signal from the encoder and to drive a modulated data signal based thereupon to the secondary winding.

13. The apparatus of claim 12, further comprising a divider coupled to the secondary winding and configured to extract therefrom a reference frequency; and wherein the clock signal is based upon the reference frequency.

14. An apparatus, comprising:
   a first oscillator circuit;
   a second oscillator circuit;
   a transformer having:
      a primary winding coupling the first oscillator circuit to the second oscillator circuit, and
      a secondary winding magnetically coupled with the primary winding;
   a first outgoing communications circuit coupled to the second oscillator circuit;
   a first incoming communications circuit coupled to the primary winding of the transformer;
   a second outgoing communications circuit coupled to the secondary winding; and
   a second incoming communications circuit coupled to the secondary winding;
   wherein the primary winding comprises:
      a first winding portion coupled to the first oscillator circuit;
      a second winding portion coupled to the second oscillator circuit; and
      a center tap common to the first and second winding portions;
   wherein the first outgoing communications circuit is coupled to the second winding portion of the primary winding; and
   wherein the first incoming communications circuit is coupled to the second winding portion of the primary winding.

15. The apparatus of claim 14, wherein the first outgoing communications circuit comprises:
   an encoder; and
   a modulator coupled to the encoder and the second oscillator circuit.

16. The apparatus of claim 14, wherein the first incoming communications circuit comprises:
   a demodulator coupled to the primary winding; and
   a decoder coupled to the demodulator.

17. The apparatus of claim 14, wherein the second outgoing communications circuit comprises:
   an encoder; and
   a modulator coupled to the encoder and the secondary winding.

18. The apparatus of claim 14, wherein the second incoming communications circuit comprises:
   a demodulator coupled to the secondary winding; and
   a decoder coupled to the demodulator.

19. An apparatus, comprising:
   a transformer having a primary winding and a secondary winding;
   a first interface;
   a first outgoing communications circuit comprising:
      a first encoder coupled to the first interface to receive therefrom a bitstream and a clock signal, and to generate therefrom a data signal, and
      a first modulator coupled to the first encoder to receive therefrom the data signal and coupled to the primary winding and configured to modulate the data signal into a modulated data signal to be driven to the primary winding;
   a first incoming communications circuit comprising:
      a first demodulator coupled to the primary winding to receive therefrom an amplitude modulated data signal and configured to demodulate the amplitude modulated data signal to produce a received data signal, and
      a first decoder coupled to the first demodulator to receive therefrom the received data signal, and configured to decode the received data signal and to pass a decoded data signal to the first interface;
   a second interface;
   a second outgoing communications circuit comprising:
      a second encoder coupled to the second interface to receive therefrom a bitstream and a clock signal and configured to generate therefrom a data signal, and
      a second modulator coupled to the second encoder to receive therefrom the data signal and coupled to the secondary winding and configured to modulate the data signal into a modulated data signal to be driven to the secondary winding;
   a second incoming communications circuit comprising:
      a second demodulator coupled to the secondary winding to receive therefrom an amplitude modulated data signal and configured to demodulate the amplitude modulated data signal to produce a received data signal, and
      a second decoder coupled to the second demodulator to receive therefrom the received data signal and configured to decode the received data signal into a decoded data signal to be passed to the second interface; and
   a DC/AC converter coupled to the primary winding of the transformer and configured to transfer power to the primary winding of the transformer.

* * * * *